United States Patent [19]

Wolfle et al.

[11] 4,050,966

[45] Sept. 27, 1977

[54] METHOD FOR THE PREPARATION OF DIFFUSED SILICON SEMICONDUCTOR COMPONENTS

[75] Inventors: Rudolf Wolfle, Gilching; Dieter Rucker, Hohenschaftlarn; Uta Lauerer, Neugermering, all of Germany

[73] Assignee: Siemens Aktiengesellschaft, Berlin, Germany

[21] Appl. No.: 588,516

[22] Filed: June 19, 1975

Related U.S. Application Data

[63] Continuation of Ser. No. 884,616, Dec. 12, 1969, abandoned.

[30] Foreign Application Priority Data

Dec. 20, 1968 Germany .............................. 1816082

[51] Int. Cl.² ......................................... H01L 21/228
[52] U.S. Cl. ..................................... 148/188; 148/1.5; 148/186
[58] Field of Search ......................... 148/1.5, 186, 188

[56] References Cited

U.S. PATENT DOCUMENTS

| | | | |
|---|---|---|---|
| 2,974,073 | 3/1961 | Armstrong | 148/188 |
| 3,084,079 | 4/1963 | Harrington | 148/188 |
| 3,172,785 | 3/1965 | Jochems et al. | 148/1.5 |
| 3,183,130 | 5/1965 | Reynolds et al. | 148/188 |
| 3,473,533 | 4/1969 | Dingwall | 148/188 |
| 3,485,684 | 12/1969 | Mann et al. | 148/188 |
| 3,601,888 | 8/1971 | Engeler et al. | 148/188 X |

*Primary Examiner*—L. Dewayne Rutledge
*Assistant Examiner*—J. M. Davis
*Attorney, Agent, or Firm*—Herbert L. Lerner

[57] ABSTRACT

A method for preparing semiconductor components from silicon as the base material. The components have at least two zones, produced by diffusion, with different conduction type. The diffusion of the individual zones takes place from dopant containing nickel layers applied at the semiconductor crystal surface. The nickel layer including the dopant contained therein, is applied by chemical means.

3 Claims, 12 Drawing Figures

METHOD FOR THE PREPARATION OF DIFFUSED SILICON SEMICONDUCTOR COMPONENTS

This is a continuation of application Ser. No. 884,616, filed Dec. 12, 1969, now abandoned.

Our invention relates to a method for preparation of semiconductor components from silicon as base material which show at least two zones of distinct conduction type produced by diffusion, where the diffusion of the individual zones occurs out of the solid material, containing the doping substance put on the semiconductive crystal surface.

The covering of silicon crystal disks with doping substance for production of semiconductive structural elements for subsequent diffusion in general is carried out in an oven containing an atmosphere to the dopant. The number of crystal disks which can simultaneously be covered in one working operation is more or less limited by the distance which the disks must have, according to the uniformity requirement of the coating. For semiconductive structural elements with high capacity which display relatively large dimensions, this procedure is very expensive, as only a limited number of crystal disks can be coated simultaneously.

The so-called "Paint-on Process" is known from German Pat. 1,046,785. This process is better suitable for the preparation of large area semiconductive structural elements, as it can be less expensively executed. In this method, a vitrifying compound, known per se, containing the dopant substance is placed in the form of a paste onto the semiconductive crystal surface, dried and fused into the surface. Under the glaze on the semiconductive crystal surface a zone provided with the corresponding current type of the doping substance is formed.

This method has the disadvantage that on one side of the semiconductive crystal disk only one p- doped zone or one n- doped zone can be produced and merely a combination of both endowments in parallel, as is necessary for the production of transistors. Furthermore, with the paint-on method, because of irregular thickness of layers, very often components with a wide variation of the electrical parameters, are obtained.

Our invention has as an object the task of making, in a simple rational way, diffused silicon semiconductor components, especially transistors, with parallel different conductivity regions, using solid dopant containing substances on the semiconductive crystal surface.

According to our invention, as the solid material, at least one nickel layer with a dopant is used. This nickel coating, including the contained dopant, is chemically deposited on the intended regions of the smiconductive crystal surface, selective or totally. Zones of different conductive type are produced, employing as dopant source, the nickel layers provided with the corresponding dopants.

It is in the framework of this invention, that several nickel layers with different doping in parallel, and/or in sequential strata, are deposited in such a way, that at subsequent diffusion in the semiconductor article, distinct doping is simultaneously obtained in the concentration or conductive type.

In a further development, it is intended to regulate the content of the doping substance in the nickel layer between 3 and 10 percent. Phosphorus is used for the production of an n-doped zone, while boron is used in conjunction with nickel for a p-doped zone.

According to one example, the nickel coat containing the dopant is deposited in a thickness of the layer of about $0.2\mu$. With variation of the gauge of the nickel layer(s), the deposited amount of the dopant (boron or phosphorus) can also be altered.

In the framework of the present invention, it shall also be involved to carry out the diffusion process in two steps, whereby the crystal disks at first, using a spacer, are diffused, until none of the liquid phase is anymore existent on the silicon surface and the residual diffusion is performed with close-packed crystal disks without a distance from one another. In the first step of the process, the crystal disks are present in mounting support, so that a distance between the disks is assured and that the disks do not stick together in the liquid phase, resulting from the nickel coat together with the silicon. The remaining diffusion can then be carried out by piling, without a distance between the disks. Thus, a considerably more efficient diffusion installation is possible.

For the first diffusion step, 60 minutes at 1250° C in an inert gas atmosphere or in the air, are sufficient. A further advantage of the invention is, that simultaneously with the doping, a plating with nickel takes place, so that at subsequent diffusion, the working life of the minority charge carrier remains very much higher than without nickel. Furthermore, the later barrier free contact of the corresponding regions is considerably facilitated.

In the following, the invention shall be explained by means of examples, making reference to the drawing in which:

FIGS. 5–27 show the sequence of steps used in Example 2; and

FIGS. 8–12 show the sequence of steps used in Example 3.

The numerals used in each sequence remain constant from FIG. to FIG.

EXAMPLE 1

Figure 1:
FIGS. 1–4 show the sequence of steps used in Example 1.
Figure 2:

FIGS. 1–4 show a procedure for producing a diffused npn-silicon transistor in accordance with the invention. In FIG. 1, the entire surface of a p-dopant silicon crystal disk 1 was coated with a $SiO_2$ layer 2 by an oxidation process. Then the arrangement as in FIG. 2 is achieved by using the known photo etching process technique, to free those places which shall be provided with the nickel coating from the $SiO_2$ layer. Thereafter, phosphorus doped (3 to 10 percent) nickel layer 3 is provided at the upper side of the crystal disk and a lower layer 4 at the bottom side. The nickel layer is about $0.2\mu$ thick and is provided by a wet chemical treatment, wherein the arrangement with a partial oxide layer is treated at 90° C with an ammoniacal nickel-sulfate solution which contains admixtures of sodium-hypophosphite and diaminohydrogencitrate, whereby a nickel layer (3, 4) precipitates only at the free crystal surfaces.

Figure 3:
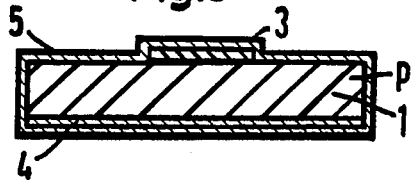

FIG. 3 shows the system of FIG. 2 after $SiO_2$ layer is completely removed. Thereafter, the entire arrangement (1, 3, 4) is covered with a second nickel layer 5, which contains boron as a dopant. The application of this nickel layer also takes place in a wet chemical treatment, wherein the crystal disk 1, which is provided with first nickel layers 3 and 4, is treated at 67° C with an ammoniacal nickel sulfate solution, which contains additions of sodium-borate, sodium-borohydrate and diaminohydrogencitrate. The thickness of the layer 5, or the boron content in this nickel layer is so adjusted, that at the subsequent diffusion, the amount of boron diffused from layer 5 into the semiconductor crystal in the regions 6 and 7 (See FIG. 4) is small compared to that from layer 3 and 4.

Figure 4:
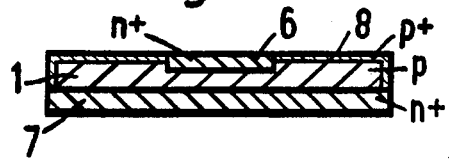

FIG. 4 shows the transistor arrangement according to the diffusion process in the temperature range of 1000° to 1300°C using as diffusion source, the nickel layers provided with the dopants. The numeral 1 shows the p-doped base zone; 6 and 7 the diffused $n+$ emitter (6) and the collector zone (7), and 8 the boron doped nickel layer produced higher doped $p+$ zone. This zone 8, like zones 6 and 7, facilitates within the individual regions the barrier free contact metallization. After application of the metal contacts, the crystal disk, on which a large number of similar arrangements is accommodated, is then divided into the individual systems, which thereafter are assembled.

EXAMPLE 2

Figure 5:
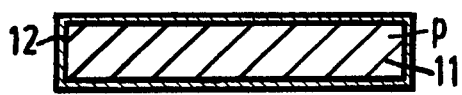

FIGS. 5 to 8 show another example of carrying out the invention. In FIG. 5 one starts from a p- doped silicon crystal disk 11. This crystal 11 has been coated by a wet chemical technique, that is with absence of current, over the entire surface, with phosphorus doped nickel layer 12, which is $0.2\mu$ thick, as described in Example 1.

Figure 6:
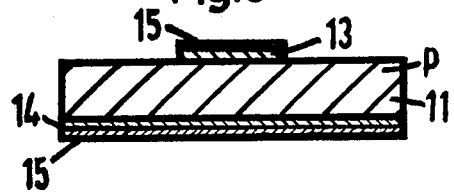
Figure 7:

Then, as seen in FIG. 6, by means of the known procedure of selective etching, the nickel layer provided with phosphorus dopant, except for the emitting and collecting regions, namely nickel layers 13 and 14, is removed. Thus, the protective layer 15 which consists, for example, of photo varnish, wax, or picein, or of an oxide or nitride layer, for masking for an additional nickel deposition, is prepared. FIG. 7 shows the same system as FIG. 6, whereby additionally, a second nickel layer 16 is put on, which is provided with a 5 percent boron doping and is formed on the free surface by the same technique as described in the first example.

Figure 8:
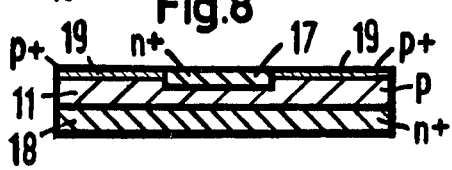

FIG. 8 shows the transistor system obtained by diffusion in the temperature range of 1000° to 1300° C, using the two nickel layers as sources of diffusion. Thus, at 11 is the $p-$ doped basic zone; at 17 is the $n+$ doped emitting zone; at 18 is the $n+$ doped collecting zone and at 19 is the boron doped nickel layer forming the more highly doped $p+$ zone across which the base zone is contacted. The subsequent treatment is made as described in Example 1.

EXAMPLE 3

Figure 9:

FIGS. 9 to 12 show the manufacturing process of a pnp diffused transistor. In FIG. 9, one starts from an $n-$ doped silicon crystal disk 21, which is provided over the entire surface with a $p-$ doped nickel layer 22 as described above. Subsequently, as is evident from FIG. 10, a $p-$ doped zone 23 is produced by a diffusion process, and the complete system is furnished with a $SiO_2$ layer 24 into which a window is etched in region 25 by the known photo etching technique.

Figure 10:
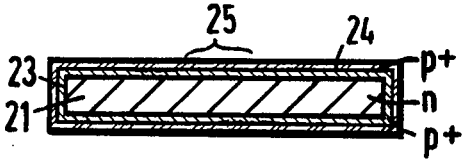
Figure 11:
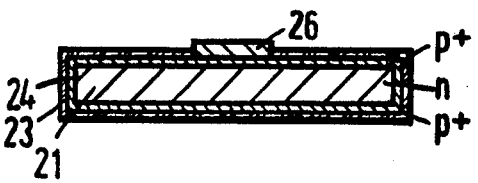

Thereafter, the second nickel layer provided with the phosphorus dopant 26, is deposited in the region of this window, as described in Example 1 (See FIG. 11). The same reference numerals as in FIG. 9 and 10 are applied.

Figure 12:
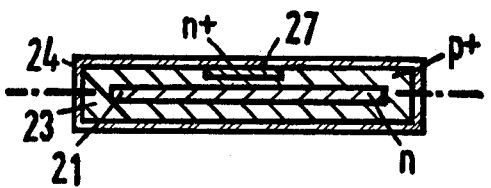

FIG. 12 shows the transistor system after the diffusion process (eventually in two steps, if a maximum efficiency is neceaary) in the temperature range 1000° to 1400° C. The numeral 27 indicates $n+$ zone formed with the use of a phosphorus doped nickel layer, as diffusion source. For the other regions, the same reference numerals as in FIGS. 10 or 11 apply.

Before further processing, the entire system is lapped from the back side to the plane denoted by dotted lines, or etched so that the $n-$ doped zone 21 comes to the surface as collecting zone and can be provided with a contact metal layer. The further processing takes place as described in Examples 1 and 2.

We claim:
1. In a method of preparing semiconductor components of silicon having at least two zones of different conduction type produced by diffusion from dopant-containing solid substance applied to the surface of a semiconductor crystal, the solid substance being at least one layer of nickel substantially 0.2 $\mu$ thick and containing a concentration of from 3 to 10 percent of respective dopant, the nickel layer including the dopant contained therein being deposited chemically upon selected zones of the semiconductor crystal surface, and the dopant at the selected zones being diffused into the respective zones from a respective layer of nickel containing the dopant to form zones of different conduction type, the improvement therein which comprises carrying out the diffusion of the dopant into the semiconductor crystal in two steps which consist of diffusing a series of disks formed of semiconductor crystal and separated by respective spacers until a liquid phase is no longer present at the respective surface of the crystal disks, and thereafter removing the spacers and packing the crystal disks tightly against one another and completing the diffusion thereof.

2. Method according to claim 1 wherein the crystal disks are tightly packed against one another by piling them one on top of the other.

3. Method according to claim 2 wherein the semiconductor is silicon, and the first-mentioned diffusion step is carried out at 1250° C for 60 minutes.

* * * * *